Aug. 14, 1962 T. SAPINO 3,049,630
TRANSFORMER-COUPLED PULSE AMPLIFIER
Filed Oct. 23, 1958
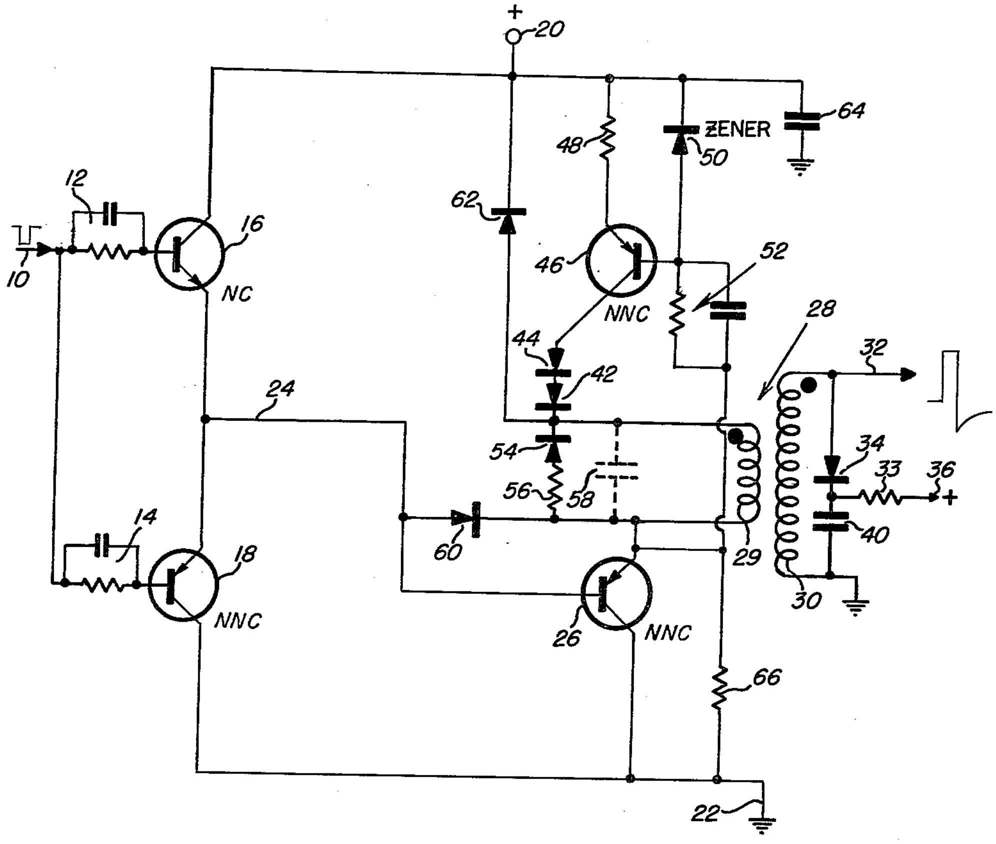
INVENTOR.
THEODORE SAPINO
BY Henry L. Hanson
ATTORNEY United States Patent Office 3,049,630

Patented Aug. 14, 1962

3,049,630
TRANSFORMER-COUPLED PULSE AMPLIFIER

Theodore Sapino, Framingham, Mass., assignor to Minneapolis-Honeywell Regulator Company, Minneapolis, Minn., a corporation of Delaware Filed Oct. 23, 1958, Ser. No. 769,212
9 Claims. (Cl. 307—88.5)

A general object of the present invention is to provide a new and improved electrical apparatus for use in amplifying an electrical signal pulse. More specifically, the present invention is concerned with a new and improved electrical pulse amplifier of the transformer coupled type which is characterized by its ability to amplify an electrical input pulse and reproduce the electrical pulse in the output in a regulated form with the timing of the electrical output pulse being substantially identical with the input pulse.

Transformer coupled amplifiers are generally used for purposes of providing either a current step up or a voltage step up of an input signal. The use of a transformer coupled amplifier further provides a means for isolating an input circuit from an output circuit insofar as direct current is concerned. The use of a transistor in combination with a transformer in an amplifier configuration, as heretofore known, has presented certain difficulties which, in many applications, are undesirable. These undesirable features are the result of the use of a transistor in such a circuit. At high frequencies, or when pulses of very short time duration are to be passed, a transistor has certain operational limitations due to the storage effect of the semiconductor body used. This storage effect is sometimes referred to as the presence of minority carriers or holes in the base region of the transistor which are created during the pulse. At the termination of the input pulse, these carriers or holes require a certain time to diffuse out of the base region. The time it takes for these minority carriers to be diffused out will have a direct effect on the timing of an output pulse with respect to an input pulse.

It is one of the features of the present invention in the combination illustrated to substantially eliminate the adverse effect of transistor hole storage in an electrical pulse amplifier.

It is accordingly a further object of the present invention to provide a new and improved electrical pulse amplifier utilizing a transistor as the amplifying element in the combination wherein the timing of an electrical input pulse may be reproduced with substantially no change in the output.

Another serious difficulty involving a circuit combination of a transistor amplifier having a transformer in the output, particularly where electrical pulses are being transmitted, lies in the fact that the inductive kick on the transformer has the effect of creating a very high voltage on the transistor which, if not appropriately suppressed, will exceed the breakdown voltage of the transistor and thereby cause its destruction. The present invention has overcome this difficulty by providing a unique arrangement of a suppressing means in combination with the amplifying circuit to prevent the feedback of any inductive kicks from the output transformer.

It is therefore another object of the invention to provide a new and improved transistor-transformer amplifier circuit wherein signal suppression means are provided in the circuit to prevent unwanted signals in the circuit from damaging the components thereof and wherein the suppression circuit does not interfere with the circuit operation when it is performing its normal amplifying function.

In order to further protect the present pulse amplifier circuit, and to stabilize the circuit, the circuit has been provided with a further unique circuit combination which serves to place certain bounds on the current that will pass. This further circuit takes the form of a current regulated source which is connected in series with a transformer and the amplifying transistor. This current regulated source may well take the form of a further transistor having a Zener diode connected as the voltage regulating or stabilizing element of the regulator combination. As utilized in the present arrangement, the regulated current source functions in such a manner that the current flowing through the transistor of the regulator, as well as the transistor of the amplifier, is limited or held within predetermined bounds. Thus, it is impossible to get too high a collector current in either of the transistors even though the current gain of one or both of the transistors might be higher than that desired. As will be apparent from the description of the circuit that follows, this addition of the current regulating combination to the transistor-transformer amplifier has been achieved without adversely affecting the response time or reproduction time of the amplifier circuit.

It is therefore a further object of the present invention to provide a new and improved transistor-transformer amplifier circuit incorporating a new and improved pulse current regulating element wherein such element may comprise a further transistor having a Zener diode as the regulating and stabilizing means in the circuit thereof.

The foregoing objects and features of novelty which characterize the invention as well as other objects of the invention are pointed out with particularity in the claims annexed to and forming a part of the present specification. For a better understanding of the invention, its advantages and specific objects attained with its use, reference should be had to the accompanying drawings and descriptive matter in which there is illustrated and described a preferred embodiment of the invention.

Referring to the single FIGURE, there is here illustrated a preferred form of the present invention which is required to operate with signal pulses whose approximate pulse width is in the range of one microsecond.

An input terminal 10 is connected by way of a pair of R-C networks 12 and 14 to a pair of transistor devices 16 and 18 respectively. The transistor device 16 includes the normal base, emitter, and collector terminals and is preferably of the NPN type. Transistor 18 likewise includes the normal base, emitter, and collector terminals, and is preferably of the PNP type. The emitter-collector terminals of the transistor 16 and 18 are connected in a series circuit between a positive potential terminal 20 and a ground terminal 22.

The transistors 16 and 18 are used for signal switching purposes to change the potential at the junction between the two transistors at lead 24 from a potential which is approximately the voltage at the potential point 20 to substantially ground potential as represented by the ground 22 depending upon which of the two transistors is conducting. As arranged in the present circuit, the transistor 16 is normally arranged to be conducting and the transistor 18 is normally cut off. Since the two transistors are of opposite conductivity types, the application of a negative input pulse to the terminal 10 is effective to switch the transistor 18 to be conductive and the transistor 16 to be non-conductive.

The signal variations on the lead 24 are coupled into the input of an amplifying transistor 26, the latter having the normal base, emitter, and collector terminals and being of the PNP type. The transistor 26 is connected in an emitter-follower circuit configuration with the collector terminal thereof being connected to the ground 22 and the emitter thereof being connected to a transformer 28 at the primary winding 29. A secondary winding 30 leads to an output circuit terminal 32. Connected across a secondary winding is a suitable clamping diode 34 leading to a positive potential terminal 36 by way of a coupling resistor 33. A condenser 40 is connected in series with a diode 34 across the secondary 30.

The emitter terminal of the transistor 26 is coupled to the positive power supply terminal 20 by way of the primary winding 29, a pair of diodes 42 and 44, a transistor 46, and a resistor 48. The transistor 46 includes the normal base, emitter, and collector electrodes and is of the PNP type. Connected to the base terminal thereof is a suitable regulating device in the form of a Zener diode 50. Also connected to the base terminal of the transistor 46 is an R-C network 52 which has its other terminal connected to the emitter terminal of the transistor 26.

In order to damp out any kickback voltage due to collapsing flux in the transformer 28, there is provided a shunt circuit in the form of a diode 54 and a resistor 56.

Depending upon the type of circuit with which the present circuit is used, there may be more or less amounts of distributed capacity in the output circuit which is effectively reflected to be in parallel with the primary 29. This distributed capacity is represented at 58. In order to minimize the effect of this distributed capacity 58 in the circuit upon turnoff, there is provided a further pair of diodes 60 and 62 which serve with transistor 16 to provide a discharge circuit for this capacity once it has been charged by the operation of the transistor 26.

A further condenser 64 is connected to the supply terminal 20 while a biasing resistor 66 is shown connected to the ground terminal 22 and to the emitter terminal of the transistor 26. Appropriate designations appear in the drawings alongside each of the transistors to indicate whether or not they are normally conducting or non-conducting.

In considering the operation of the circuit illustrated, it is first assumed that the circuit is in the quiescent state. When in a quiescent state, as pointed out above, the transistor 16 will be biased into the conducting range while the transistor 18 will be cut off. Consequently, the potential of the input lead 24 of the transistor base terminal 26 will be at approximately the potential of the positive power supply terminal 20. With this positive potential on the base terminal of the transistor 26, this transistor will be cut off. The emitter potential of transistor 26 will be slightly less positive because it is so biased by the diode 60 which is connected to ground by way of the resistor 66.

Quiescently, with an assumed input at +20 volts, the potential of the emitter of transistor 16 is at 19.75 volts. This is the same as the base potential of transistor 26. Transistor 26 is cut off because of the diode 60 and biasing resistor 66. It is cut off because its emitter potential (19.5 volts) is lower than its base potential. The base current injected into transistor 46 is quite small, being approximately one-quarter volt divided by the base resistor of transistor 46. However, negligible collector current can flow in transistor 46 because of the diodes 42 and 44. Collectively they have a threshold voltage of one-half volt before any current can flow through them (an appropriate silicon diode could be used instead of the two diodes 42 and 44 if desired, since a silicon diode has a one-half volt threshold). Essentially, diodes 42 and 44 are in a very high impedance region so that negligible collector current flows. Biasing resistor 66 is chosen low enough such as to absorb this current and insure that transistor 26 is cut off.

The secondary winding 30 of the transformer 28 will have no signal thereon and the output 32 will have no signal thereon because of the quiescent state of the transistor 26. Further, since the diode 34 is functioning only as a clamping diode, the potential on the terminal 32 will be effectively at ground.

When a negative input pulse is applied to the input terminal 10 as shown, the conducting states of the transistors 16 and 18 will be reversed so that now the transistor 16 will be cut off while the transistor 18 will be rendered conducting. When the terminal lead 24 is effectively connected to the ground terminal 22, by way of the conductive transistor 18, the potential on the base terminal of the transistor 26 will be dropped to substantially the ground potential at 22. As soon as the transistor 26 is rendered conducting, the potential of the emitter terminal thereof approaches ground potential and this will be immediately reflected through the condenser of the network 52 to the base electrode of the transistor 46. This will render the transistor 46 conducting so that now a current flow circuit may be traced from the positive terminal 20 through the resistor 48, transistor 46, diodes 44 and 42, primary winding 29, and transistor 26 to the ground terminal 22. The current flowing through the primary winding 29 will induce a signal in the secondary winding 30 so that an output pulse will appear on the terminal 32 as shown. The level of the current flowing through the primary winding 29 will be carefully regulated by the action of the Zener diode 50 which is connected to the base terminal of the transistor 46, and thereby holds the current flow through the transistor 46 to a predetermined level. Since the transistor 46 is in series with the transistor 26, it will be apparent that the current flow through both of the transistors will be regulated. With the proper selection of the regulating Zener diode 50, the circuit may be made insensitive to the variations in the transistor beta either in the transistor 46 or the transistor 26.

As soon as the trailing edge of the input pulse is received at the terminal 10, the conducting states of the transistors 16 and 18 will again be switched back to their normal quiescent state wherein the transistor 16 is conducting and the transistor 18 is cut off. Thus, the potential on the lead 24 will switch from a ground potential back to the potential of the positive power supply terminal 20. This will have the effect of cutting off the transistor 26 so that the potential on the emitter terminal thereof will return immediately to the quiescent value which is substantially at the positive potential of the power supply terminal 20. The signal will also be coupled to the R-C network 52 and to the base terminal of the transistor 46 to cut this transistor off. The collapse of the current flow through the primary winding 29 and the resultant flux reversal in the transformer 28 will produce an inductive kick in the primary 29. This inductive kick will be effectively damped out by the diode 54 and the resistor 56 so as to eliminate the possibility of the voltage appearing at this primary winding 29 from exceeding the rated maximum operating potential of the transistor 46.

When the circuit has been switched into the conducting state, the effective interelectrode or distributed capacity represented at 58 will be charged. In order that the circuit effect a rapid recovery, it is essential that the charge on this condenser be removed without adversely affecting the current flow through the primary winding 29. This is achieved by a circuit which effectively short circuits this interelectrode or distributed capacity. The shorting circuit may be traced from the upper terminal of the capacitor 58 through diode 62, transistor 16, lead 24, and diode 60 to the lower terminal of the capacitor 58.

Once the circuit has been cut off, the circuit will return to the quiescent state above described. Thus, once again, the transistor 46 will be essentially cut off for the reason that there is effectively no operating potential on the collector electrode thereof. Further, the voltage divider which includes the diode 60 and the resistor 66 establishes a potential on the emitter terminal of the transistor 26 which, with respect to the potential on the lead 24, is less than that required for the transistor 26 to conduct.

Since the transistor 26 is operating in the emitter-follower configuration, the potential on the base terminal thereof and the potential on the emitter will tend to be substantially the same. This will be so even though there may have been minor minority carriers or holes injected in the base region. In other words, the minority carriers or holes in the base region will be effective only in controlling the current flow related to the collector. Thus, in the illustrated combination, the emitter-follower is capable of reproducing, insofar as time length of pulse is concerned, the input pulse with substantially no change insofar as the output pulse time length is concerned.

It will also be apparent that with the unique regulating circuit provided for use in this amplifier combination that the collector current at the peak of any particular signal will be limited to fall within predetermined bounds and that this limitation in the circuit will be independent of the transistor beta, regardless of how hard the transistor may be driven.

It will be further apparent from the foregoing description that the circuit has a very fast recovery time which is achieved in the circuit without the requirement of a special external voltage supply or the use of any voltage which is in excess or in addition to the normal supply voltage of the circuit. Further, the circuit when in the quiescent state will be seen to require substantially no standby current except a very negligible amount which is required to insure that the emitter-base junction of the transistor 26 be reversed biased.

While, in accordance with the provisions of the statutes, there has been illustrated and described the best forms of the invention known, it will be apparent to those skilled in the art that changes may be made in the apparatus described without departing from the spirit of the invention as set forth in the appended claims and that in some cases, certain features of the invention may be used to advantage without a corresponding use of other features.

What is claimed as new and for which it is desired to secure Letters Patent is:

1. An electrical pulse amplifier comprising a first transistor having base, emitter, and collector terminals, an input circuit connected to said base terminal, an output pulse transformer having a primary winding directly connected to said emitter to form a series circuit with the emitter-collector terminal circuit of said first transistor, a pair of power supply terminals connected to said series circuit, and a current regulating circuit connected in said series circuit to said emitter by way of said primary winding to limit the current flow in said series circuit to a regulated amount, said regulating circuit comprising a second transistor having base, emitter and collector terminals, a regulated potential point referenced to one of said power supply terminals, means connecting the base terminal of said second transistor to said regulated potential point, and means connecting the emitter-collector terminal circuit of said second transistor in series with said first named series circuit.

2. An electrical pulse amplifier comprising a transistor having base, emitter, and collector terminals, an input circuit connected to said base terminal, an output pulse transformer having a primary winding directly connected to said emitter terminal to form a series circuit with the emitter-collector terminal circuit of said transistor, a pair of power supply terminals connected to said series circuit, a current regulating circuit connected in said series circuit to said emitter terminal to limit the current flow in said series circuit to a regulated amount, and a diode directly coupled between said base terminal and one of said other terminals of said transistor to maintain said terminals at a potential to minimize the effect of signal delay in said transistor upon switching from a conducting state to a non-conducting state.

3. An electrical pulse amplifier circuit comprising a transistor emitter-follower circuit, a transformer having a primary winding directly connected as the output of said emitter-follower circuit such that the secondary of said transformer functions as the pulse amplifier output, a pair of power supply terminals connected in series with said circuit, and a current regulating means connected in series with said power supply terminals to the emitter of said transistor to regulate the current in said emitter-follower circuit.

4. In an electrical signal amplifier, the combination comprising a first transistor having base, emitter, and collector terminals, a second transistor having base, emitter, and collector terminals, a transformer having a primary winding and an output winding, a pair of power supply terminals, means directly connecting said primary winding to the emitter terminal of said first transistor, means connecting the emitter-collector terminals of said first and second transistors in series with said primary winding between said pair of power supply terminals, an input circuit connected to said base terminal of said first transistor, and a constant voltage device connected to said base terminal of said second transistor to maintain a regulated current in the emitter-collector circuit of said second transistor.

5. In an electrical signal amplifier, the combination comprising a first transistor having base, emitter, and collector terminals, a second transistor having base, emitter, and collector terminals, a transformer having a primary winding and an output winding, a pair of power supply terminals, means connecting the emitter-collector terminals of said first and second transistors in series with said primary winding between said pair of power supply terminals, an input circuit connected to said base terminal of said first transistor, a Zener diode means connected to said base terminal of said second transistor to maintain a constant voltage on said base terminal, a second diode connected between the base and emitter terminals of said first transistor, a third diode, and means connecting said third diode between said collector and emitter terminals of said second transistor, said second and third diodes forming a conducting path opposite to that of said first and second transistors.

6. In an electrical signal amplifier, the combination comprising a first transistor having base, emitter, and collector terminals, a second transistor having base, emitter, and collector terminals, a transformer having a primary winding and an output winding, a pair of power supply terminals, means connecting said primary winding to the emitter terminal of said first transistor, means connecting the emitter-collector terminals of said first and second transistors in series with said primary winding between said pair of power supply terminals, an input circuit connected to said base terminal of said first transistor, said input circuit comprising a pair of transistors of opposite conductivity type connected in series between said pair of power supply terminals and a connection from the junction of said pair of transistors to said base terminal of said first transistor, and a constant voltage device connected to said base terminal of said second transistor.

7. An electrical circuit comprising a first pair of transistors of opposite conductivity types connected in series in their emitter-collector paths, a pair of power supply terminals connected to said series circuit, a second pair of transistors of like conductivity type connected in series in their emitter-collector paths between said power supply terminals, a transformer having a primary winding connected to the emitter of one of said second pair of transistors in said last named series circuit, a Zener diode connected to the base terminal of one of said second pair of transistors, and a signal coupling connection from the junction of said first pair of transistors to the base terminal of the other of said second pair of transistors.

8. An electrical circuit comprising a first pair of transistors of opposite conductivity types connected in series in their emitter-collector paths, a pair of power supply terminals connected to said series circuit, a second pair of transistors of like conductivity type connected in series in their emitter-collector paths between said power supply terminals, a transformer having a primary winding connected in said last named series circuit, a Zener diode connected to the base terminal of one of said second pair of transistors, a signal coupling connection from the junction of said first pair of transistors to the base terminal of the other of said second pair of transistors, and a pair of diodes connected in series with said primary winding between said junction and one of said power supply terminals.

9. An electrical circuit comprising a first pair of transistors of opposite conductivity types connected in series in their emitter-collector paths, a pair of power supply terminals connected to said series circuit, a second pair of transistors of like conductivity type connected in series in their emitter-collector paths between said power supply terminals, a transformer having a primary winding connected in said last named series circuit, a Zener diode connected to the base terminal of one of said second pair of transistors, a signal coupling connection from the junction of said first pair of transistors to the base terminal of the other of said second pair of transistors, a pair of diodes connected in series with said primary winding and between said junction and one of said power supply terminals, and a further diode connected in parallel with said primary winding.

References Cited in the file of this patent

UNITED STATES PATENTS

| | | |
|---|---|---|
| 2,647,958 | Barney | Aug. 4, 1953 |
| 2,714,702 | Shockley | Aug. 2, 1955 |
| 2,716,729 | Shockley | Aug. 30, 1955 |
| 2,730,576 | Caruthers | Jan. 10, 1956 |
| 2,751,545 | Chase | June 19, 1956 |
| 2,757,243 | Thomas | July 31, 1956 |
| 2,810,024 | Stanley | Oct. 15, 1957 |
| 2,848,564 | Keonjian | Aug. 19, 1958 |
| 2,864,904 | Jensen | Dec. 16, 1958 |
| 2,904,742 | Chase | Sept. 15, 1959 |
| 2,905,835 | Wray | Sept. 22, 1959 |
| 2,932,783 | Mohler | Apr. 12, 1960 |

FOREIGN PATENTS

| | | |
|---|---|---|
| 149,332 | Australia | Dec. 8, 1952 |